United States Patent [19]
Fiedler

[11] Patent Number: 5,724,361
[45] Date of Patent: Mar. 3, 1998

[54] HIGH PERFORMANCE N:1 MULTIPLEXER WITH OVERLAP CONTROL OF MULTI-PHASE CLOCKS

[75] Inventor: Alan Fiedler, Minneapolis, Minn.

[73] Assignee: LSI Logic Corporation, Milpitas, Calif.

[21] Appl. No.: 614,403

[22] Filed: Mar. 12, 1996

[51] Int. Cl.$^6$ .................................................. H04J 3/02
[52] U.S. Cl. .................................. 370/537; 327/407
[58] Field of Search ............................. 370/532, 535, 370/537, 538, 540; 327/407

[56] References Cited

U.S. PATENT DOCUMENTS

| | | | |
|---|---|---|---|
| 3,358,082 | 12/1967 | Helm | 178/50 |
| 3,395,250 | 7/1968 | Lien | 179/15 |
| 3,914,553 | 10/1975 | Melindo et al. | 179/15 |
| 4,027,301 | 5/1977 | Mayer | 340/183 |
| 4,157,458 | 6/1979 | Roche | 179/15 |
| 4,445,215 | 4/1984 | Svendsen | |
| 4,728,930 | 3/1988 | Grote et al. | 340/347 |
| 4,750,149 | 6/1988 | Miller | 364/900 |
| 4,901,076 | 2/1990 | Askin et al. | 341/100 |
| 4,965,797 | 10/1990 | Yamane et al. | 370/537 |
| 5,025,257 | 6/1991 | Hartley et al. | 341/101 |
| 5,045,714 | 9/1991 | Park et al. | 370/537 |
| 5,111,455 | 5/1992 | Negus | 370/537 |
| 5,175,819 | 12/1992 | Le Ngoc | 395/250 |
| 5,182,467 | 1/1993 | Taylor et al. | 307/243 |
| 5,200,647 | 4/1993 | Motoike | 370/537 |
| 5,247,652 | 9/1993 | Uda | 395/500 |
| 5,349,653 | 9/1994 | Kurokawa et al. | 395/500 |
| 5,355,370 | 10/1994 | Fairhurst et al. | 370/537 |
| 5,463,630 | 10/1995 | Tooher | |
| 5,526,360 | 6/1996 | Kraft | 371/112 |

*Primary Examiner*—Douglas W. Olms
*Assistant Examiner*—Ajit Patel
*Attorney, Agent, or Firm*—Westman, Champlin & Kelly, P.A.

[57] ABSTRACT

An n:1 time division multiplexer includes a multiphase clock generator, a data multiplexer, a reference multiplexer, a reference generator and a comparison circuit. The multiphase clock generator has a plurality of select clock outputs with different phases. The data multiplexer has a plurality of data inputs, a plurality of select clock inputs and a data output. The select clock inputs of the data multiplexer are coupled to corresponding select clock outputs. The reference multiplexer has a plurality of reference data inputs, a plurality of select clock inputs and a first reference output. The select clock inputs of the reference multiplexer are coupled to corresponding select clock outputs. The reference generator has a second reference output. The comparison circuit has first and second comparison inputs coupled to the first and second reference outputs, respectively, and has a comparison output coupled to the plurality of select clock outputs. The comparison output adjusts an overlap between each pair of select clock outputs that are substantially 180 degrees apart in phase as a function of a comparison between the output characteristics of the first and second reference outputs.

16 Claims, 8 Drawing Sheets

HIGH PERFORMANCE N:1 MULTIPLEXER WITH OVERLAP CONTROL OF MULTI-PHASE CLOCKS

BACKGROUND OF THE INVENTION

The present invention relates to a high performance n:1 multiplexer and, in particular to a multiplexer having control over the overlap of multiphase clocks.

A time division multiplexer sequentially multiplexes a plurality of parallel data inputs to a single output for converting the parallel data inputs into a serial data stream. The sequential selection of data inputs is controlled by a clock which may have one or more phases. A typical multiphase clock includes pairs of clock signals which are 180 degrees apart in phase. The clock signals are arranged to select individual data inputs in a particular order. A ring oscillator is typically used to generate the clock signal or signals.

The characteristics of the clock signal are a critical design concern for multiplexers that are used in high speed digital systems. Clock frequency is one factor which determines the rate of data transmission. The higher the frequency, the higher the rate at which data can be transmitted. Duty cycle determines a relative time period during which a particular data input is selected. In a data serializer using a multiphase clock, clock duty cycle affects the performance of the serializer. A substantially 50% duty cycle results in an accurate transition from a serializer state during which a first data input is transmitted to the output to state during which a second data input is transmitted to the output. A conventional way of obtaining a clock having a fifty percent duty cycle in an integrated circuit is to very carefully size the transistors in the clock generation circuit and to use a circuit having a bandwidth significantly higher than the clock frequency. However, this approach results in a clock with a duty cycle which is still unacceptably sensitive to variations in process, voltage and temperature (PVT). For example, under certain PVT conditions, one or more cascaded inverting clock buffers may generate a fifty percent duty cycle clock signal at its output in response to a fifty percent duty cycle clock signal at its input. At other PVT conditions, and at a sufficiently high clock frequency, the duty cycle at the output can, in the extreme, drop to zero percent.

Overlap or crossover points of clock signals that are 180 degrees apart in phase is also a concern because the overlap controls the closeness in time at which successive data samples can be multiplexed. The overlap or cross-over points can occur at a voltage that is above or below a midpoint between a logic HIGH level and a logic LOW level. If the clock signals overlap at a logic HIGH level, more than one of the output gates in the multiplexer will be enabled simultaneously, which results in current or voltage spikes in the multiplexed data. If the clock signals overlap at a logic LOW level, there will be a brief period during which none of the output gates will be enabled, which also results in current or voltage spikes in the multiplexed data. These current or voltage spikes will cause intersymbol interference and data dependent jitter in the multiplexed data. Overlap is also sensitive to variations in PVT.

SUMMARY OF THE INVENTION

The n:1 time division multiplexer of the present invention includes a multiphase clock generator, a data multiplexer, a reference multiplexer, a reference generator and a comparison circuit. The multiphase clock generator has a plurality of select clock outputs with different phases. The data multiplexer has a plurality of data inputs, a plurality of select clock inputs and a data output. The select clock inputs of the data multiplexer are coupled to corresponding select clock outputs. The reference multiplexer has a plurality of reference inputs, a plurality of select clock inputs and a first reference output. The select clock inputs of the reference multiplexer are coupled to corresponding select clock outputs. The reference generator has a second reference output. The comparison circuit has first and second comparison inputs coupled to the first and second reference outputs, respectively, and has a comparison output coupled to the plurality of select clock outputs. The comparison output adjusts the overlap between each pair of clock outputs substantially 180 degrees apart in phase as a function of a comparison between the output characteristics of the first and second reference outputs.

In one embodiment, the comparison circuit compares a current level on the first reference output with a current level on the second reference output. If the current level on the first reference output is less than the current level on the second reference output, the comparison circuit sources an adjustment current into the true and complement clock signals. If the current level on the first reference output is greater than the current level on the second reference output, the comparison circuit sinks the adjustment current out of the true and complement clock signals.

BRIEF DESCRIPTION OF THE DRAWINGS

FIGS. 6a–6c are waveform diagrams illustrating waveforms of the multiplexer when clock overlap is low, high and zero, respectively.

DETAILED DESCRIPTION OF THE PREFERRED EMBODIMENTS

The time division multiplexer of the present invention uses a multiphase clock to multiplex parallel input data into a serial data stream by sequentially selecting data bits through a plurality of multiplexer elements. The multiplexer monitors the overlap between clock phases and adjusts the overlap through a feedback loop to ensure that there is no time during which all multiplexer elements are off and there is no time during which two multiplexer elements are on at the same time. Thus, the multiplexer transitions cleanly from one bit to the next.

Figure 1:
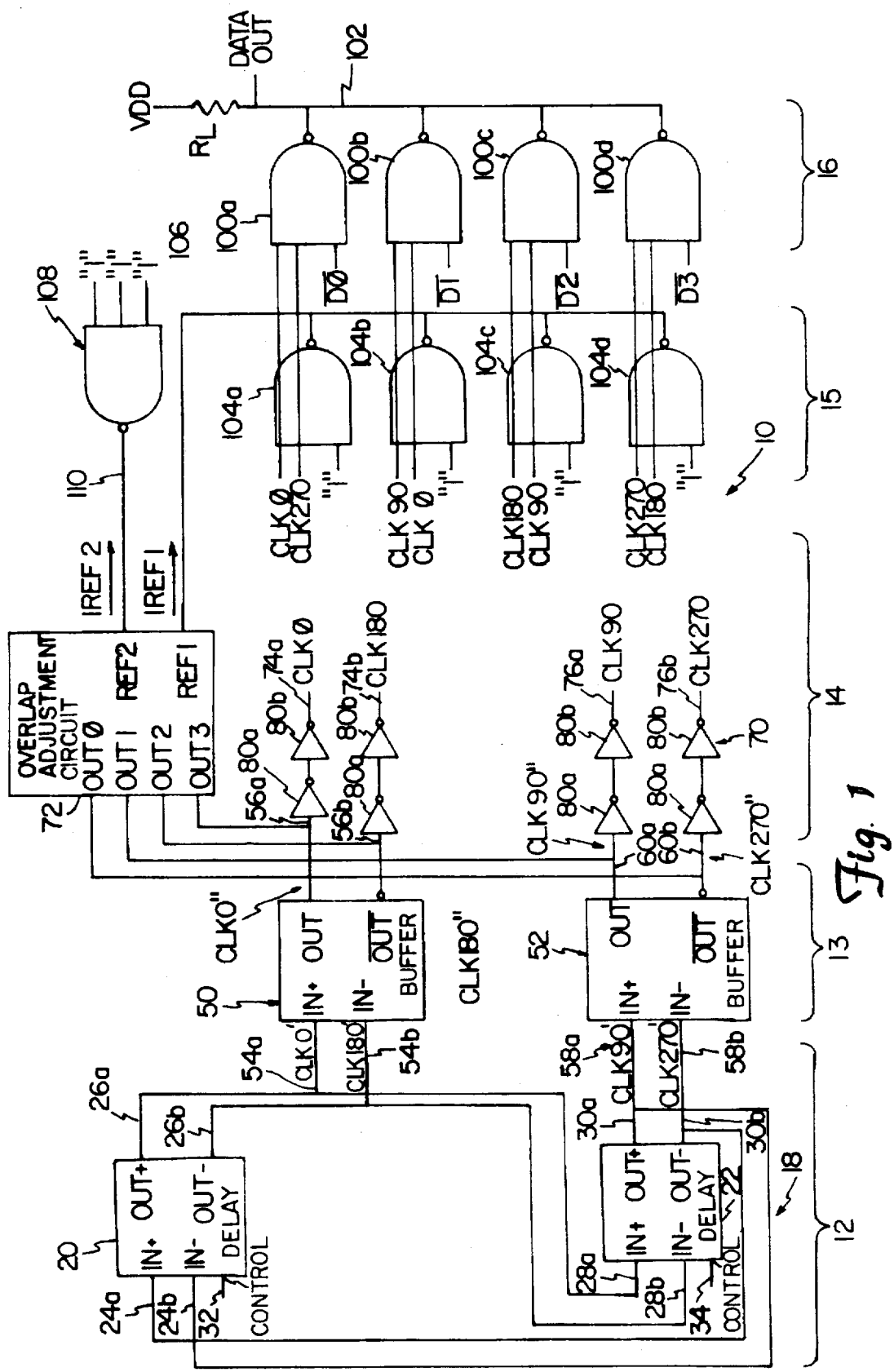
FIG. 1 is a block diagram of a 4:1 time division multiplexer according to the present invention.

FIG. 1 is a block diagram of a 4:1 time division multiplexer according to the present invention. Multiplexer 10 includes a clock generator stage 12, a differential-to-complementary CMOS buffer stage 13, a clock buffer and overlap adjustment stage 14, a reference multiplexer stage 15 and a data multiplexer stage 16.

Clock generator stage 12 has a multiphase clock generator 18 formed by a differential, voltage controlled oscillator. The oscillator includes voltage controlled delay elements 20 and 22 which are coupled together in a ring such that the circuit will oscillate. Delay element 20 includes differential inputs 24a and 24b and differential outputs 26a and 26b. The "+" and "−" designations indicate relative polarity of the inputs and outputs. Delay element 22 includes differential inputs 28a and 28b and differential outputs 30a and 30b. Outputs 26a and 26b of delay element 20 are coupled to inputs 28a and 28b of delay element 22. Outputs 30a and 30b of delay element 22 are coupled to inputs 24b and 24a of delay element 20.

Delay elements 20 and 22 further include voltage control inputs 32 and 34 which control the delay between the differential inputs and the differential outputs. In one embodiment, the control voltage is adaptively updated during operation through a control loop (not shown).

Delay element 20 generates a pair of true and complement select clock signals CLK0' and CLK180' at outputs 26a and 26b which are substantially 180 degrees apart in phase. Delay element 22 generates a pair of true and complement select clock signals CLK90' and CLK270' at outputs 30a and 30b which are substantially 180 degrees apart in phase. Select clock signals CLK90', CLK180' and CLK270' have phases relative to select clock signal CLK0', of 90, 180 and 270 degrees, respectively. As described in greater detail below, the select clock signals are logically "anded" in various combinations with parallel input data to convert the data into a serial data stream.

Figure 2:
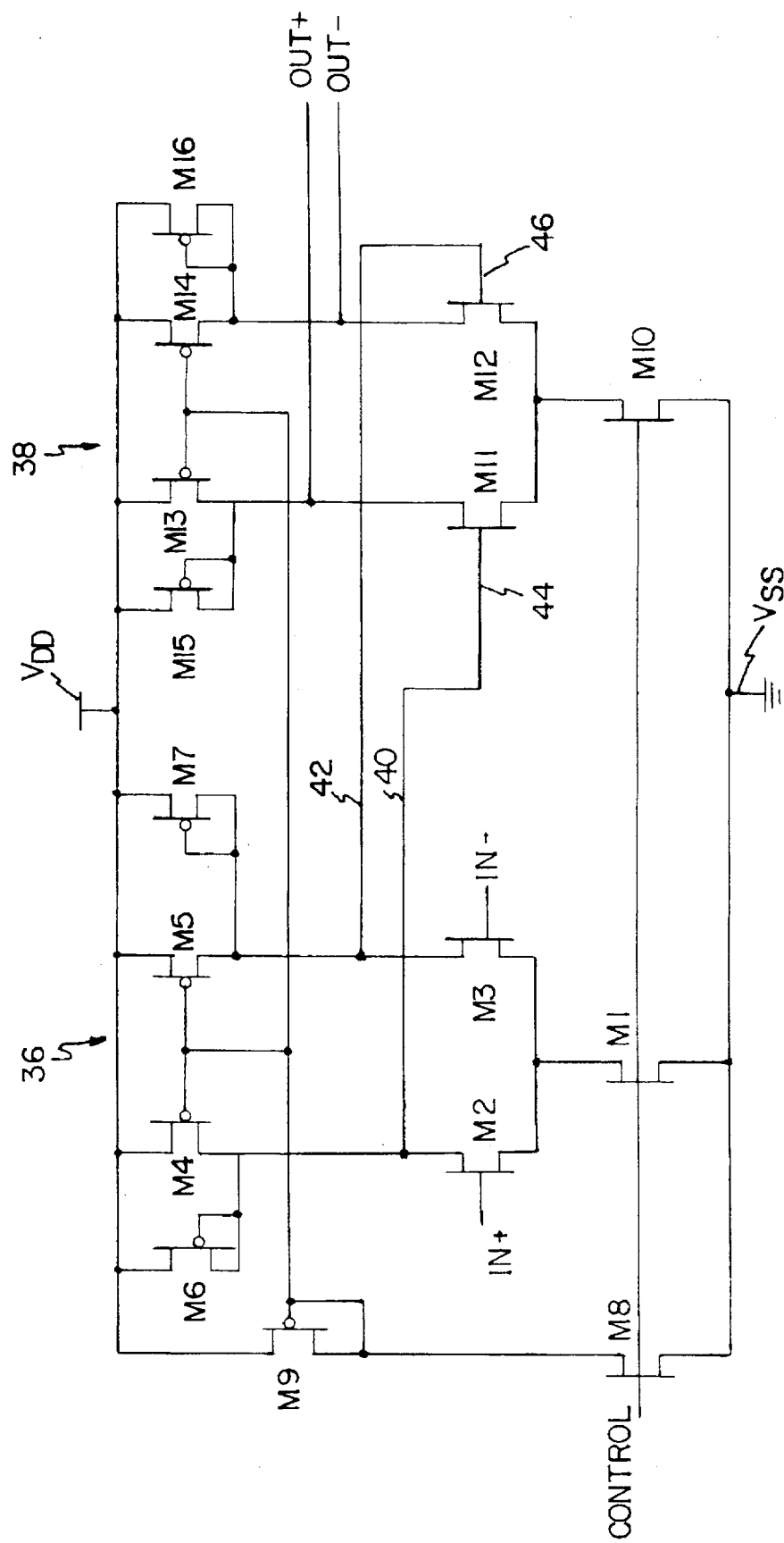
FIG. 2 is a schematic diagram of a voltage controlled delay element shown in FIG. 1.

FIG. 2 is a schematic diagram of one of the delay elements 20 and 22. The delay element includes at least two differential buffer stages 36 and 38 which provide an adequate phase shift when delay elements 20 and 22 are connected in a ring such that the oscillator will oscillate. Differential buffer stage 36 includes a controlled current source formed by n-channel transistor M1, which has a gate coupled to the voltage control input and a source coupled to voltage supply terminal VSS. The drain of transistor M1 is coupled to the sources of n-channel transistors M2 and M3, which are coupled together to form a differential transistor pair. The gates of transistors M2 and M3 are coupled to input terminals IN+ and IN−, respectively. Transistors M4 and M5 are p-channel, pull-up transistors which are coupled between voltage supply terminal VDD and the drains of transistors M2 and M3, respectively. Transistors M6 and M7 are p-channel, diode-connected clamp transistors which are coupled between voltage supply terminal VDD and the drains of transistors M4 and M5, respectively. The gates of transistors M4 and M5 are biased by a bias circuit formed by transistors M8 and M9. Transistor M8 is an n-channel transistor having a source coupled to voltage supply terminal VSS and a drain coupled to the drain and gate of p-channel transistor M9. The source of transistor M9 is coupled to voltage supply terminal VDD.

Current supplied by transistor M1 is directed through transistors M2 and M3 as a function of the relative polarity of the voltages on input terminals IN+ and IN−. For example, if the voltage on input terminal IN+ is relatively positive with respect to the voltage on input terminal IN−, the current supplied by transistor M1 is directed through transistor M2. The drain of transistor M2 falls LOW until clamp transistor M6 turns on. In steady state, transistors M4 and M6 each conduct approximately one-half of the current supplied by transistor M1. Likewise, if the voltage on input terminal IN− is relatively positive with respect to the voltage on input terminal IN+, the current supplied by transistor M1 is directed through transistor M3. The drain of transistor M3 goes LOW until clamp transistor M7 turns on, at which time transistors M5 and M7 each supply approximately one-half of the current supplied by transistor M1.

The drains of transistors M2 and M3 form outputs 40 and 42 of differential buffer stage 36. Outputs 40 and 42 are coupled to inputs 44 and 46, respectively, of differential buffer stage 38. Differential buffer stage 38 includes transistors M10–M16 which are coupled together in the same manner as transistors M1–M7 and have a similar operation. The drains of transistors M11 and M12 form output terminals OUT+ and OUT−. The delay element shown in FIG. 2 is one example of a delay element that can be used with the present invention. Other delay elements can also be used.

Referring back to FIG. 1, select clock signals CLK0', CLK90', CLK180' and CLK270' are provided to differential-to-complementary CMOS buffers 50 and 52 within stage 13. Buffer 50 includes differential inputs 54a and 54b and complementary outputs 56a and 56b. Inputs 54a and 54b are coupled to outputs 26a and 26b of delay element 20. Buffer 52 includes differential inputs 58a and 58b and complementary outputs 60a and 60b. Inputs 58a and 58b are coupled to outputs 30a and 30b of delay element 22.

Buffers 50 and 52 convert the differential select clock signals CLK0', CLK90', CLK180' and CLK270' into complementary select clock signals CLK0", CLK90", CLK180" and CLK270". Buffers 50 and 52 preferably have an output resistance on outputs 56a, 56b, 60a and 60b that is sufficiently high so that overlap of each pair of clock outputs substantially 180 degrees apart in phase can be easily adjusted by sourcing or sinking an equal current into or out of each select clock output within stage 14.

Figure 3:
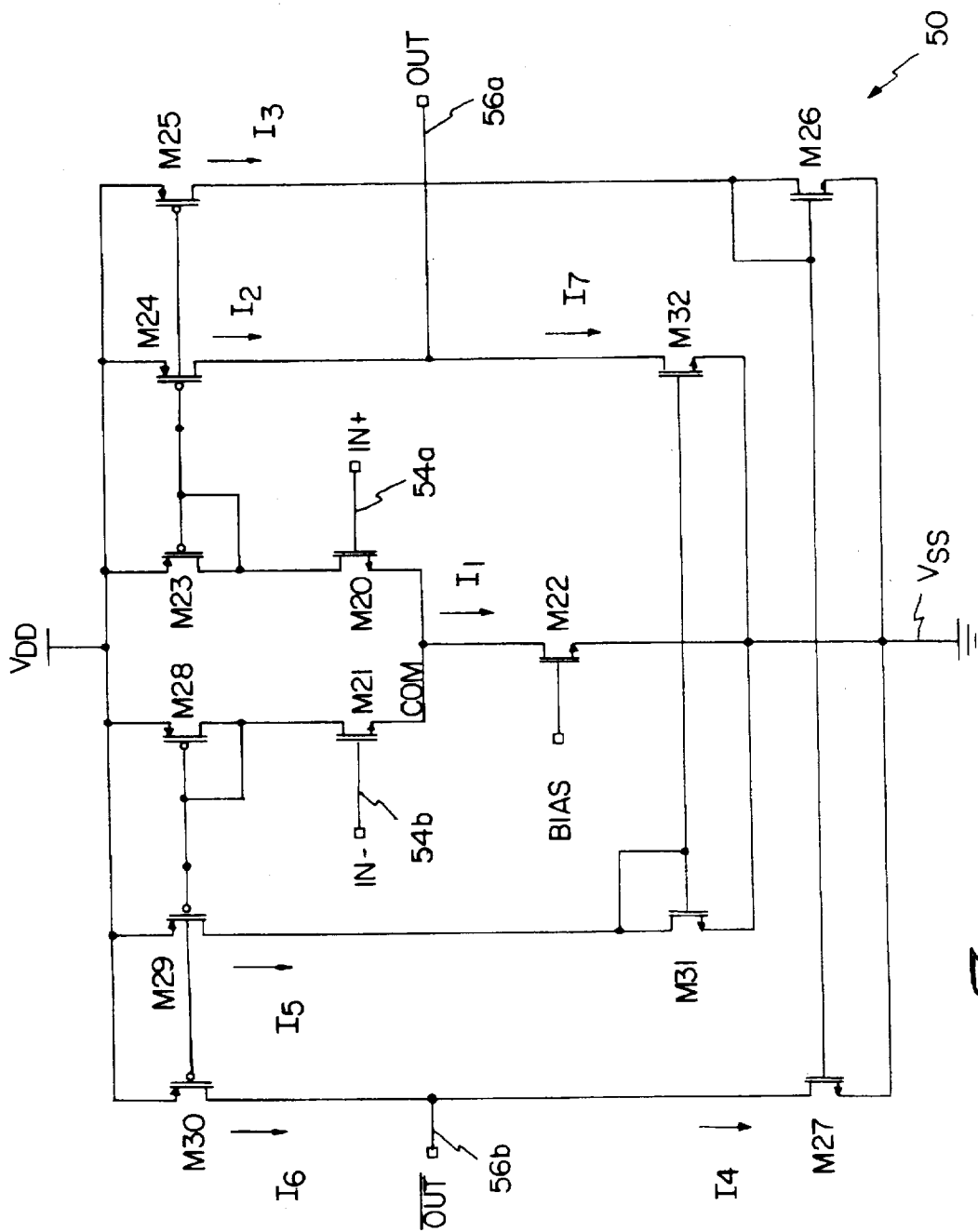
FIG. 3 is a schematic diagram of a differential-to-complementary CMOS buffer shown in FIG. 1.

FIG. 3 is a schematic diagram of buffer 50. The circuit shown in FIG. 3 is an example of a differential-to-complementary CMOS buffer which is suitable for use with the present invention. Other circuit configurations can also be used. Buffer 50 is a balanced comparator with differential inputs 54a and 54b and complementary outputs 56a and 56b. Inputs 54a and 54b are coupled to the gates of transistors M20 and M21 which form a differential transistor pair for steering current I1 through the pair as a function of the relative polarity of the input signals. Current I1 is provided by a current source formed by an n-channel transistor M22 which is coupled between the sources of transistors M20 and M21 and voltage supply terminal VSS. A BIAS signal is applied to the gate of transistor M22. The BIAS signal is generated by a bias circuit (not shown) to establish a substantially constant current I1 through transistor M22.

If the signal applied to input 54a is positive with respect to the signal applied to input 54b, transistor M20 will be on and transistor M21 will be off. Current I1 is directed through transistor M20 and p-channel transistor M23, which is coupled between the drain of transistor M20 and voltage supply terminal VDD. Transistor M23 is coupled to p-channel transistors M24 and M25 to form a current mirror which mirrors current I1 to the drains of transistors M24 and M25 as currents I2 and I3. Current I2 which flows through transistor M24 pulls output 56a to a logic HIGH level. Transistor M25 provides current I3 to n-channel transistor M26. Transistor M26 is coupled to n-channel transistor M27 to form a current mirror which mirrors current I3 to the drain of transistor M27 as current I4. Current I4 pulls output 56b to a logic LOW level. Outputs 56a and 56b are thus complementary.

If the signal applied to input 54a is negative with respect to the signal applied to input 54b, transistor M20 will be off and transistor M21 will be on. Current I1 is directed through transistor M21 and p-channel transistor M28, which is coupled between the drain of transistor M21 and voltage supply terminal VDD. Transistor M28 is coupled to p-channel transistors M29 and M30 to form a current mirror which mirrors current I1 to the drains of transistors M29 and M30 as currents I5 and I6. Current I6 which flows through transistor M30 pulls output 56b to a logic HIGH level. Transistor M29 provides current I5 to n-channel transistor M31. Transistor M31 is coupled to n-channel transistor M32 to form a current mirror which mirrors current I5 to the drain of transistor M32 as current I7. Current I7 pulls output 56a to a logic LOW level.

Referring back to FIG. 1, clock buffer and overlap adjustment stage 14 includes clock buffers 70 and clock overlap adjustment circuit 72. Clock buffers 70 include CMOS inverter pairs 80a and 80b which are coupled together in series between outputs 56a, 56b, 60a and 60b and outputs 74a, 74b, 76 a and 76b, respectively. Clock buffers 70 square-up the edges of select clock signals CLK0', CLK90', CLK180' and CLK270'. These squared-up select clock signals are labeled CLK0, CLK90, CLK180 and CLK270. The squared-up clock signals drive reference and data multiplexer stages 15 and 16.

Data multiplexer stage 16 includes four data multiplexer elements formed by NAND gates 100a, 100b, 100c and 100d. NAND gates 100a–100d are three-input, open-drain NAND gates having one input coupled to a corresponding data input $\overline{D0}$, $\overline{D1}$, $\overline{D2}$ and $\overline{D3}$. The remaining inputs are coupled to respective combinations of select clock signals CLK0, CLK90, CLK180 and CLK270. The outputs of each NAND gate 100a–100d are coupled to a common data output 102. Data output 102 is coupled to voltage supply terminal VDD through a resistive load $R_L$. Load $R_L$ converts an output current from NAND gates 100a–100d into an output voltage. During operation, the select clock signals sequentially "enable" each NAND gate 100a–100d and thereby allow an inverse of a corresponding data bit on inputs $\overline{D0}$, $\overline{D1}$, $\overline{D2}$ and $\overline{D3}$ to pass to data output 102. The data multiplexer elements therefore convert parallel input data provided on inputs $\overline{D0}$, $\overline{D1}$, $\overline{D2}$ and $\overline{D3}$ to a serial stream of data on output 102.

Figure 4:
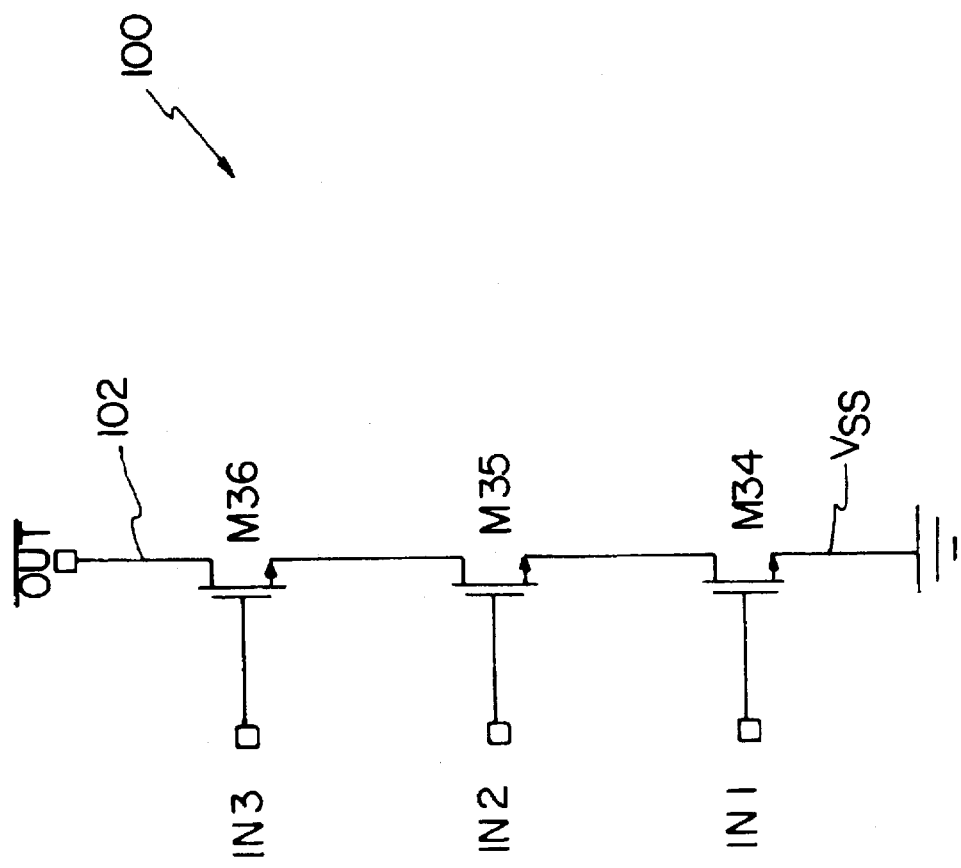
FIG. 4 is a schematic diagram of a three-input open-drain NAND gate shown in FIG. 1.

FIG. 4 is a schematic diagram of one of the three-input NAND gates 100a–100d. NAND gate 100 is formed by three series connected n-channel MOSFETs M34–M36. Inputs IN1, IN2 and IN3 are coupled to the gates of transistors M34–M36. The source of transistor M34 is coupled to voltage supply terminal VSS. The drain of transistor M34 is coupled to the source of transistor M35. The drain of transistor M35 is coupled to the source of transistor M36. The drain of transistor M36 is coupled to data output 102. If all inputs IN1–IN3 are logic HIGH, NAND gate 100 sinks a fixed current from data output 102. This NAND gate shown in FIG. 4 is one example of a mutliplexer element that can be used with the present invention. Other multiplexer elements can also be used.

Referring again to FIG. 1, variances in clock overlap can cause performance problems in data multiplexer stage 16. If the pairs of select clock signals substantially 180 degrees apart in phase overlap at a logic HIGH level, the output of more than one NAND gate 100a–100d in data multiplexer stage 16 will be enabled simultaneously during transitions between one multiplexer element to the next. This will result in current or voltage spikes in the multiplexed data since the multiplexer sinks additional current from data output 102. Likewise, if the pairs of select clock signals substantially 180 degrees apart in phase overlap at a logic LOW level, there will be a brief period during each bit transition at which no NAND gate in data multiplexer stage 16 is enabled. As a result, the multiplexer sinks less current from data output 102 than normal, which can also cause current or voltage spikes. These current or voltage spikes cause signal transitions on the data multiplexer output 102 to be displaced from their correct locations, resulting in jitter.

Reference multiplexer stage 15 and clock overlap adjustment circuit 72 in FIG. 1 ensure that the data multiplexer transitions cleanly from one data bit to the next. In a preferred embodiment, reference multiplexer stage 15 is identical to data multiplexer stage 16, except for the data inputs provided to the multiplexer and the load driven by the multiplexer. Reference multiplexer stage 15 includes three-input NAND gates 104a, 104b, 104c and 104d. One input of each NAND gate 104a–104d is tied to a logic HIGH level. The remaining inputs of NAND gates 104a–104d are coupled to respective combinations of select clock signals CLK0, CLK90, CLK180 and CLK270 in the same manner as the inputs of NAND gates 100a–100d. The outputs of NAND gates 104a–104d are coupled to a reference output 106. NAND gates 104a–104d sequentially sink a first reference current $I_{REF1}$ as a function of select clock signals CLK0, CLK90, CLK180 and CLK270.

Reference multiplexer stage 15 further includes a reference generator 108 which generates a second reference current $I_{REF2}$ on reference output 110 which is substantially the same as, and preferably identical to, reference current $I_{REF1}$ when a single NAND gate 104a–104d is enabled by the select clock signals. In the embodiment shown in FIG. 1, reference generator 108 includes a three-input open-drain NAND gate which has all three inputs tied to a logic HIGH level.

Clock overlap adjustment circuit 72 is coupled in a feedback loop between reference outputs 106 and 110 and outputs 56a, 56b, 60a and 60b of buffers 50 and 52 for sinking current into or sourcing current out of clock select signals CLK0", CLK90", CLK180" AND CLK270" as a function of reference currents $I_{REF1}$ and $I_{REF2}$. Reference outputs 106 and 110 are coupled to reference inputs REF1 and REF2, respectively. Outputs OUT0, OUT1, OUT2 AND OUT3 are coupled to outputs 56a, 56b, 60a and 60b, respectively.

Clock overlap adjustment circuit 72 monitors the difference between reference current $I_{REF1}$ and reference current $I_{REF2}$. Depending on which reference current is larger, clock overlap adjustment circuit 72 sources or sinks a current proportional to this difference into or out of outputs 56a, 56b, 60a and 60b to adjust the overlap of the select clock signals until the difference is substantially zero. Clock overlap adjustment circuit 72 essentially determines whether the number of reference multiplexer elements that are enabled during transitions from one element to the next is greater than, less than or equal to one, since reference current $I_{REF2}$ represents a single selected element and reference current $I_{REF1}$ increases and decreases with the number of enabled elements. In an alternative embodiment (not shown) reference currents $I_{REF1}$ and $I_{REF2}$ are converted into reference voltages, which are then compared by clock overlap adjustment circuit 72, with suitable modifications.

Figure 5:
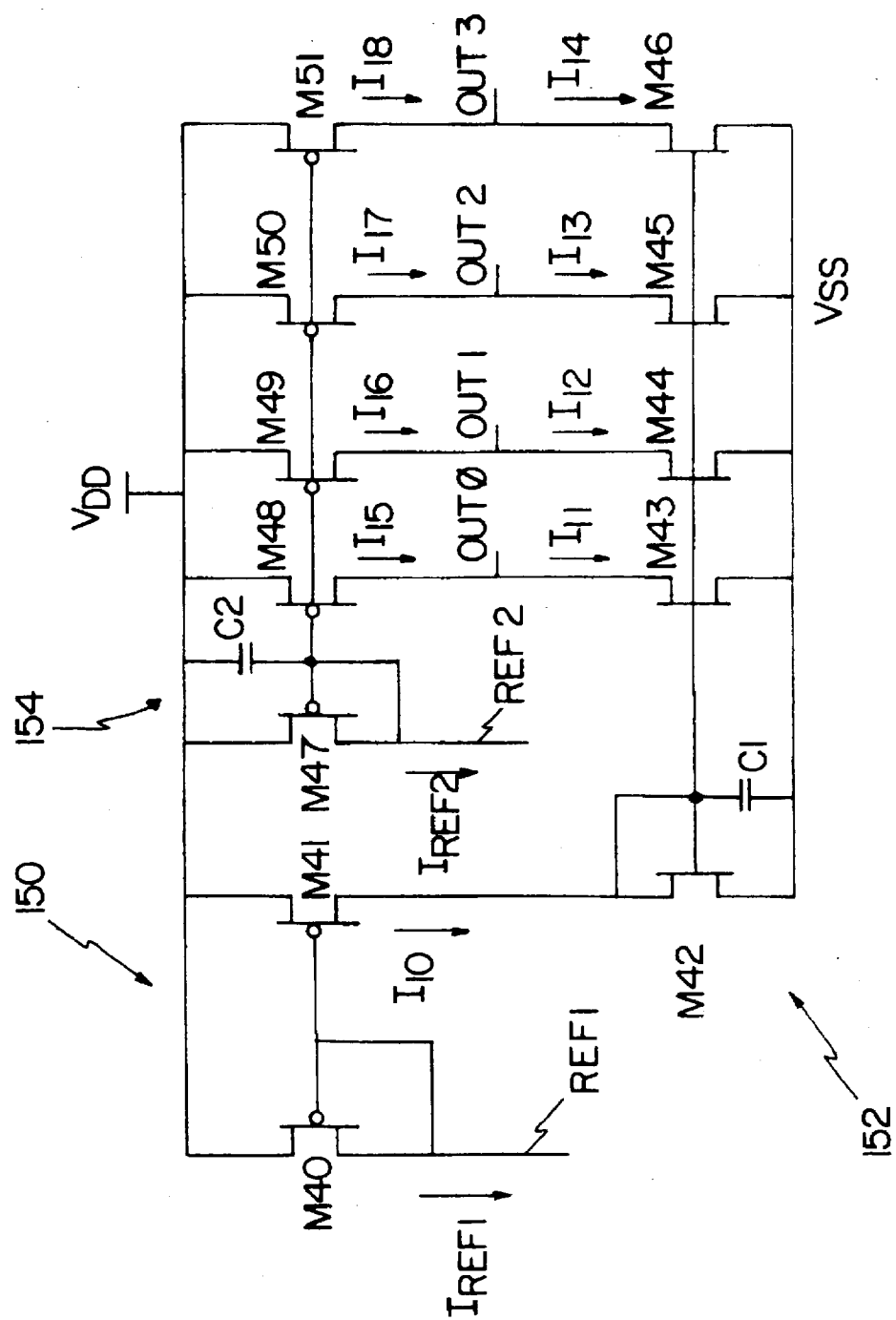
FIG. 5 is a schematic diagram of a clock overlap adjustment circuit shown in FIG. 1.

FIG. 5 is a schematic diagram of clock overlap adjustment circuit 72. Circuit 72 includes a first current mirror 150 formed by p-channel transistors M40 and M41, a second current mirror 152 formed by n-channel transistors M42, M43, M44, M45 and M46, and a third current mirror 154 formed by p-channel transistors M47, M48, M49, M50 and M51. Transistor M40 is connected as a diode between voltage supply terminal VDD and input terminal REF1 and serves as a load for reference output 106 (shown in FIG. 1). Current mirror 150 mirrors current $I_{REF1}$ from the drain of transistor M40 to the drain of transistor M41, as current I10. Current I10 is then mirrored from the drain of transistor M42 to the drains of transistors M43–M46, as currents I11–I14, respectively. The drains of transistors M43–M46 are coupled to output terminals OUT0–OUT3, respectively, and serve as current sinks for outputs OUT0–OUT3.

Transistor M47 is connected as a diode between voltage supply terminal VDD and input terminal REF2. Transistor M47 serves as a load for reference output 110 (shown in FIG. 1). Current mirror 154 mirrors reference current $I_{REF2}$ from the drain of transistor M47 to the drains of transistors M48–M51 as currents I15–I18, respectively. The drains of transistors M48–M51 are coupled to outputs OUT0–OUT3, respectively, and serve as current sources for outputs OUT0–OUT3. During operation, circuit 72 either sources current into or sinks current out of outputs OUT0–OUT3 as a function of the difference between reference currents $I_{REF1}$ and $I_{REF2}$. Capacitors C1 and C2 provide loop stability and rejection of power supply noise.

Figure 6A:
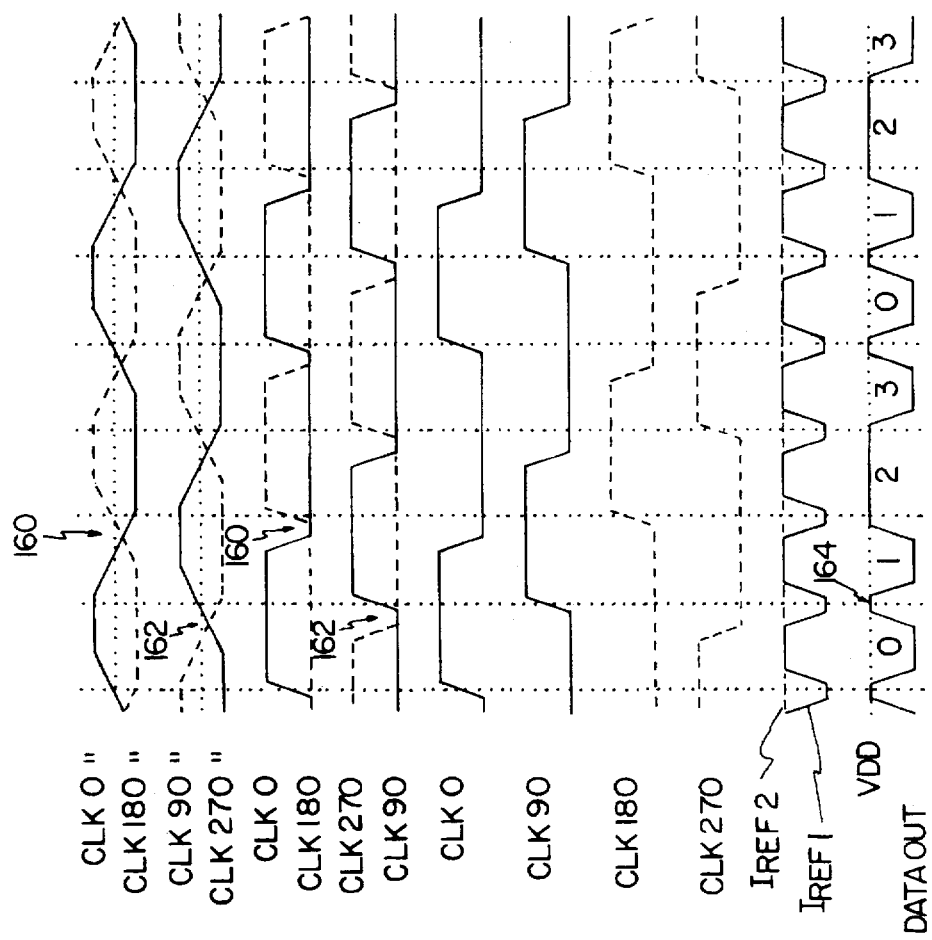
Figure 6B:
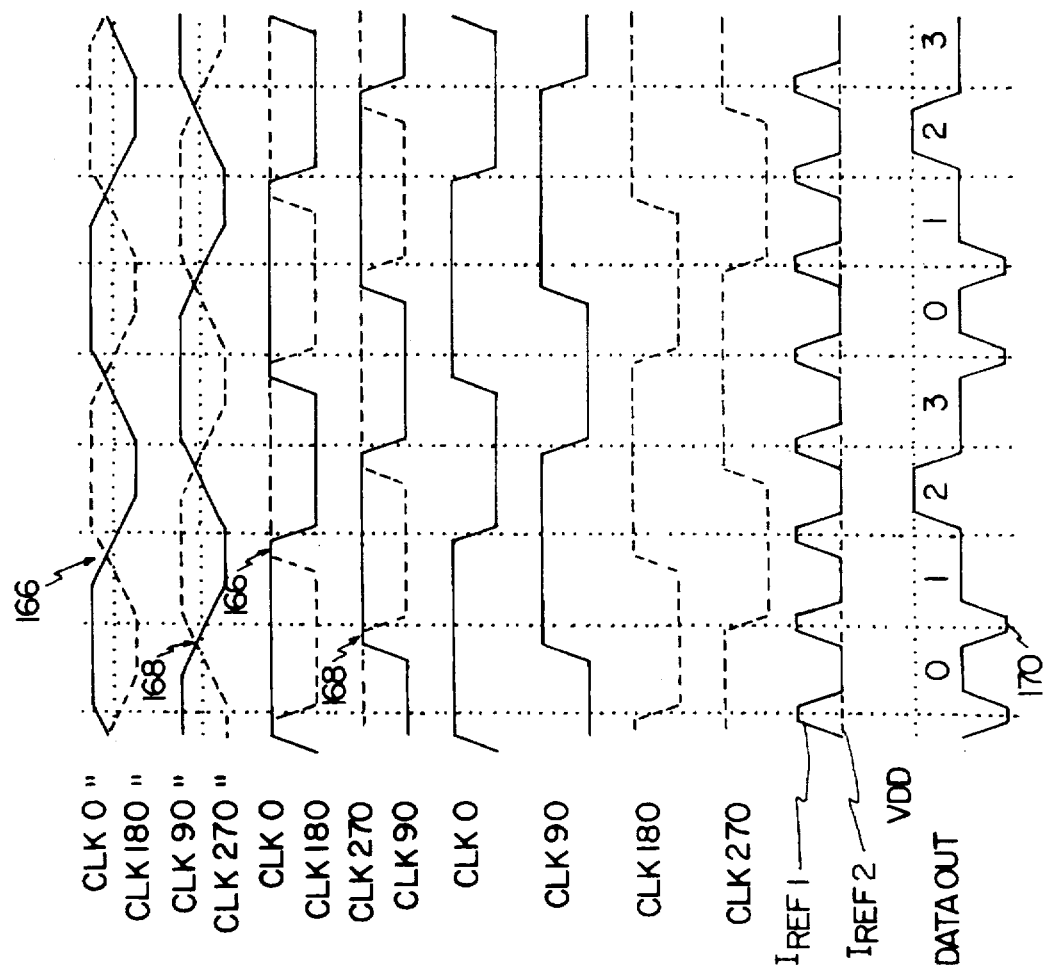
Figure 6A:
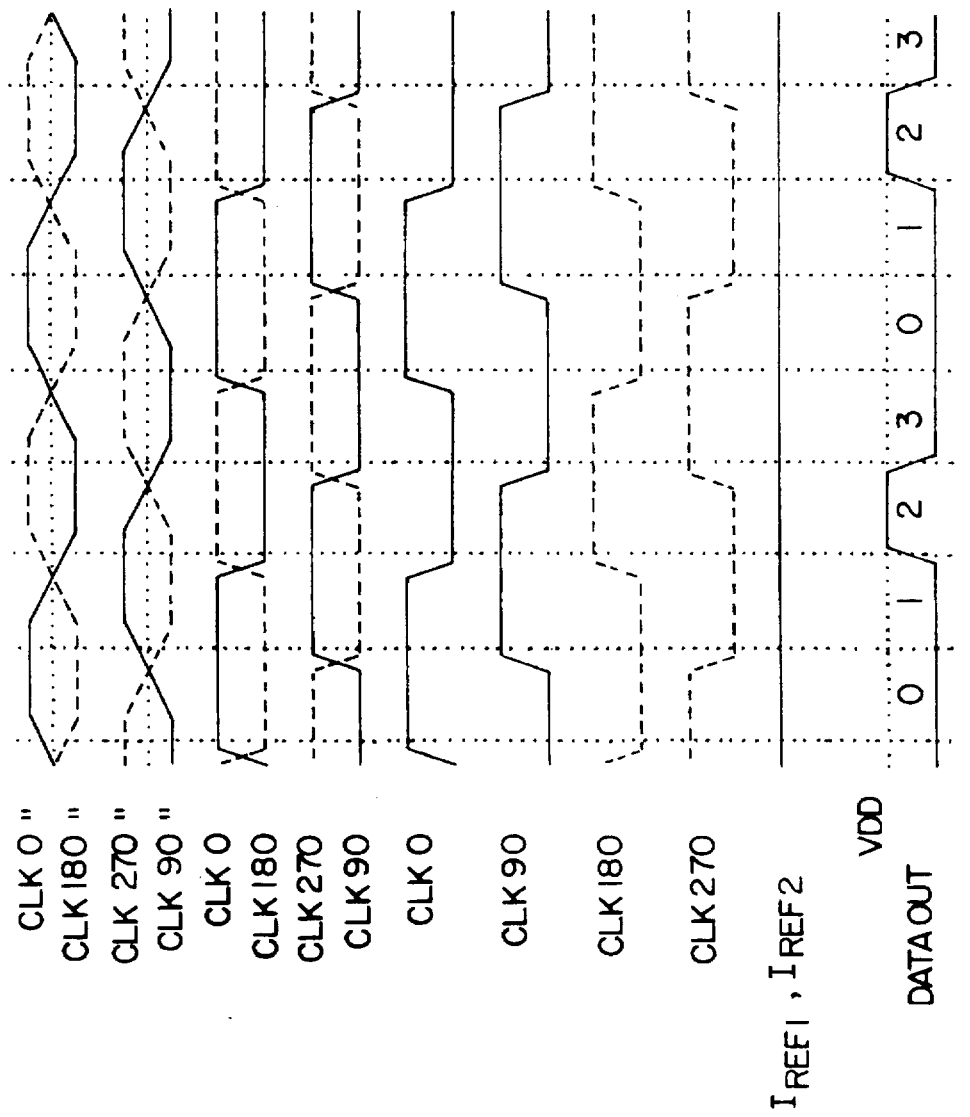

FIGS. 6a–6c are waveform diagrams which show waveforms that result when select clock signals CLK0" and CLK90" exhibit low, high and zero overlap with select clock signals CLK180" and CLK270" (shown in phantom), respectively. In FIG. 6a, the clocks overlap low. At arrow 160, CLK0" and CLK180" cross over as the signals transition from HIGH to LOW and LOW to HIGH, respectively. The signals cross over at a logic LOW level. As a result, the squared select clock signals CLK0 and CLK180 are both logic LOW at transition 160. Likewise, select clock signals CLK90" and CLK270" cross over at a logic LOW level, at arrow 162. Squared select clock signals CLK90 and CLK270 are therefore both LOW at the transition.

Since the true and complement phases of the select clock signals are both LOW at the bit transitions, the output voltage on data output 102 briefly goes to a logic HIGH level between each bit transition, as shown at 164 in the data output waveform at the bottom of FIG. 6a. During that brief period, no element of data multiplexer 16 is enabled. In FIG. 6a, $\overline{D0}=1$, $\overline{D1}=1$, $\overline{D2}=0$ and $\overline{D3}=1$. The "0", "1", "2" and "3" inserted in the data output waveform represent data bits D0, D1, D2 AND D3, respectively. As a result of the low overlap, the window during which data is valid at the data output 102 is narrowed by the time during which the select clocks overlap LOW.

Reference currents $I_{REF1}$ and $I_{REF2}$ are also shown in FIG. 6a ($I_{REF2}$ shown in phantom). The average value of reference current $I_{REF1}$ is much less than the average value of $I_{REF2}$ since there is a brief period during each bit transition that no element of the reference is sinking current. Since $I_{REF2} > I_{REF1}$ at the transitions, clock overlap adjustment circuit 72 sources current into select clock signals CLK0", CLK90", CLK180" and CLK270" which tends to pull the select clock signals HIGH, which in turn tends to cause the signals not to cross over LOW.

In FIG. 6b, select clock signals CLK0" and CLK90" exhibit high overlap with select clock signals CLK180" and CLK270". In this case, the data output waveform at data output 102 is different from that shown in FIG. 6a, but the result is the same. The window during which data is valid at the data multiplexer output is narrowed by a time during which the clocks overlap HIGH. The overlap is shown at transitions 166 and 168, for example. The data output voltage, instead of always going HIGH in between bit transitions, will go to a LOW value which is twice as low as the proper LOW in between bit transitions, as shown at 170 for example. When adjacent data bits are both zero, there is a period of time when two elements of the data multiplexer are both on (since the clocks overlap HIGH), which results in twice the normal pull-down current on the multiplexer load resistor $R_L$ (shown in FIG. 1). The average value of the reference current $I_{REF1}$ is now greater than the average value of reference current $I_{REF2}$. Clock overlap adjustment circuit 72 sinks current from the select clock signals CLK0", CLK90", CLK180" and CLK270", which tends to pull the signals LOW, which in turn tends to cause the signals not to cross over HIGH.

In FIG. 6c, the true and complement phases of the select clock signals overlap neither high nor low. The data output voltage at data output 102 transitions cleanly from one bit to the next, and there is no time during which no multiplexer element is on (as in FIG. 6a when the clocks overlap LOW) or when two multiplexer elements are on at the same time (as in FIG. 6b when the clocks overlap HIGH). Clock overlap adjustment circuit 72 makes no adjustment to the relative overlap of select clock signals CLK0", CLK90", CLK180" and CLK270" since reference currents $I_{REF1}$ and $I_{REF2}$ are equal.

The time division multiplexer of the present invention provides accurate control over the overlap of multiphase clocks. This maximizes the window during which data is valid at the multiplexer output for a given frequency. The overlap is continuously and automatically adjusted with changes in process, voltage and temperature. The time division multiplexer of the present invention is particularly useful as a serializer for high speed serial data streams between integrated circuits, such as application specific integrated circuits (ASICs). Serial data streams pass data at a very high rate from one integrated circuit to the next. In one embodiment, the time division multiplexer of the present invention serializes data at 1 gigabit per second.

The time division multiplexer of the present invention can easily be extended to produce an additional data output signal $\overline{DATA\ OUT}$ which is a complement of the data output signal on data output 102. In this embodiment, the data multiplexer stage is duplicated and provided with data input signals D0, D1, D2 and D3 which are complements of $\overline{D0}$, $\overline{D1}$, $\overline{D2}$ and $\overline{D3}$. This embodiment is especially useful for driving a differential serial data stream off of an integrated circuit, or for driving the differential inputs of a differential output buffer which buffers the multiplexer output signals and drives a differential output signal off-chip.

Although the present invention has been described with reference to preferred embodiments, workers skilled in the art will recognize that changes may be made in form and detail without departing from the spirit and scope of the invention. For example, The present invention has been described with reference to a 4:1 time division multiplexer, but can be implemented as an n:1 time division multiplexer, where n is an integer. The number of circuit elements and select clock signals can be scaled up or down as desired to implement a different size multiplexer. Also, the present invention can be used with virtually any type of multiplexer circuit. In addition, any multiphase clock generator can be used with the present invention. For example, the clock generator may generate rail-to-rail rather than low-level differential clock signals, in which case the differential-to-complementary CMOS buffers would not be required.

Individual signals in the time division multiplexer of the present invention can be active HIGH or LOW, and corresponding circuitry can be converted to suit a particular convention. The present invention can be implemented with discrete components, digital logic that is embedded in an integrated circuit or a combination of both. The term "coupled" used in the specification and in the claims includes various types of connections or couplings and includes a direct connection or a connection through one or more intermediate components. The term "current source" includes current sources that source or sink current.

What is claimed is:

1. A time division multiplexer comprising:
   a multiphase clock generator having a plurality of select clock outputs with different phases;
   a data multiplexer having a plurality of data inputs, a plurality of select clock inputs and a data output, wherein the select clock inputs of the data multiplexer are coupled to corresponding select clock outputs;
   a reference multiplexer having a plurality of reference data inputs, a plurality of select clock inputs and a first reference output, wherein the select clock inputs of the reference multiplexer are coupled to corresponding select clock outputs;
   a reference generator having a second reference output; and
   a comparison circuit having first and second comparison inputs coupled to the first and second reference outputs, respectively, and having a comparison output coupled to the plurality of select clock outputs.

2. The time division multiplexer of claim 1 wherein:
   the reference multiplexer further includes a plurality of reference multiplexer elements which are sequentially enabled by the select clock inputs and couple the reference data inputs to the first reference output, wherein the first reference output has an output characteristic that is a function of a number of reference multiplexer elements that are enabled during transitions from one reference multiplexer element to the next; and
   the second reference output has an output characteristic that is substantially the same as the output characteristic of the first reference output when a single reference multiplexer element is enabled.

3. The time division multiplexer of claim 2 wherein the reference generator comprises an additional reference multiplexer element having a continuously enabled state.

4. The time division multiplexer of claim 1 wherein the plurality of reference multiplexer elements and data multiplexer elements each comprise an open-drain NAND gate.

5. The time division multiplexer of claim 1 wherein the data multiplexer comprises an open-drain 4:1 multiplexer having a resistive load coupled to the data output.

6. The time division multiplexer of claim 1 wherein the comparison circuit comprises a plurality of comparison outputs with each comparison output coupled to a corresponding select clock output.

7. The time division multiplexer of claim 6 wherein the comparison circuit comprises:
   a first current input coupled to the first reference output;
   a second current input coupled to the second reference output;
   a first current source comprising a first current mirror having an input coupled to the first current input and having an output;
   a first current sink comprising a second current mirror having an input coupled to the output of the first current source and having a plurality of outputs; and
   a second current source comprising a third current mirror having an input coupled to the second current input and having a plurality of outputs which are coupled to corresponding outputs of the second current mirror and which form the plurality of comparison outputs.

8. The time division multiplexer of claim 1 and further comprising:
   a clock buffer coupled between each select clock output and the data and reference multiplexers.

9. The time division multiplexer of claim 1 wherein the multiphase clock generator comprises:
   an oscillator having at least one pair of differential clock outputs; and
   a differential-to-complementary buffer having a pair of differential inputs coupled to the pair of differential clock outputs and having first and second complementary logic outputs which form the plurality of select clock outputs.

10. The time division multiplexer of claim 9 wherein the oscillator comprises a differential, voltage controlled oscillator.

11. The time division multiplexer of claim 10 wherein the differential, voltage controlled oscillator comprises:
    first and second voltage controlled delay elements, each having a relatively positive and a relatively negative differential input terminal and a relatively positive and a relatively negative differential output terminal;
    wherein the relatively positive and relatively negative differential output terminals of the first voltage controlled delay element for a first pair of the differential clock outputs and are coupled to the relatively positive and relatively negative differential input terminals, respectively, of the second voltage controlled delay element; and
    wherein the relatively positive and relatively negative differential output terminals of the second voltage controlled delay element form a second pair of the differential clock outputs and are coupled to the relatively negative and relatively positive differential input terminals, respectively, of the first voltage controlled delay element.

12. The time division multiplexer of claim 1 wherein each delay element comprises at least two differential buffer stages.

13. The time division multiplexer of claim 1 wherein the multiphase clock generator comprises:
    an oscillator comprising a plurality of differential, voltage controlled delay elements coupled together in a ring, wherein each delay element has a differential input coupled to a differential output of another delay element in the ring; and
    a plurality of differential-to-complementary buffers, wherein each buffer has a differential input coupled to the differential output of a corresponding delay element and has first and second complementary logic outputs, which form the plurality of select clock outputs.

14. An n:1 time division multiplexer comprising:
    a plurality of data inputs and a data output;
    a plurality of reference data inputs and a first reference output, wherein the reference data inputs are coupled to a predetermined logic level;
    clock generator means for generating at least one pair of select clock signals which are approximately 180 degrees out of phase with one another and which cross over one another at a voltage between a logic HIGH level and a logic LOW level;
    data multiplexer means for multiplexing the plurality of data inputs to the data output as a function of the select clock signals;
    reference multiplexer means for multiplexing the plurality of reference data inputs to the first reference output as a function of the select clock signals;

reference generator means for generating a second reference output; and p1 means coupled to the clock generator means for adjusting the voltage at which the select clock signals cross over one another as a function of the first and second reference outputs.

15. A method of serializing a plurality of parallel data inputs to a data output, comprising:

generating at least one pair of select clock signals which are approximately 180 degrees out of phase with one another and which cross over one another at a voltage between a logic HIGH level and a logic LOW level;

multiplexing the plurality of parallel data inputs to the data output as a function of the pair of select clock signals;

multiplexing a predetermined logic voltage to a first reference output as a function of the pair of select clock signals;

generating a second reference output;

comparing the first and second reference outputs; and adjusting the voltage at which the select clock signals cross over one another as a function of the comparison.

16. The method of claim 15 wherein:

comparing the first and second reference outputs comprises comparing a current level on the first reference output with a current level on the second reference output; and adjusting the overlap comprises:

sourcing an adjustment current into the pair of select clock signals if the current level on the first reference output is less than the current level on the second reference output; and sinking the adjustment current out of the pair of select clock signals if the current level on the first reference output is greater than the current level on the second reference output.

* * * * *